(12) United States Patent
Tamura et al.

(10) Patent No.: US 8,933,621 B2
(45) Date of Patent: Jan. 13, 2015

(54) LIGHT EMITTING DEVICE

(71) Applicant: Nichia Corporation, Anan, Tokushima (JP)

(72) Inventors: Takeshi Tamura, Anan (JP); Hiroaki Shozui, Anan (JP); Yasuo Fujikawa, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 14/036,444

(22) Filed: Sep. 25, 2013

(65) Prior Publication Data

US 2014/0084781 A1   Mar. 27, 2014

(30) Foreign Application Priority Data

Sep. 26, 2012 (JP) ................. 2012-212114

(51) Int. Cl.
  *H05B 33/02* (2006.01)
  *H05B 33/14* (2006.01)
  *H01L 33/50* (2010.01)
  *H01L 25/075* (2006.01)

(52) U.S. Cl.
  CPC .............. *H01L 33/50* (2013.01); *H01L 33/502* (2013.01); *H01L 25/0753* (2013.01); *H01L 2924/0002* (2013.01)
  USPC .............................. 313/501; 313/503; 362/235

(58) Field of Classification Search
  CPC ........... C09K 11/7792; C09K 11/7774; C09K 11/7706; C09K 11/00; C09K 11/0838; H01L 51/5012; H01L 33/50; H01L 51/0081; H01L 51/52; H01L 33/501; H01L 51/5278; H01L 33/26; H01L 31/055; H01L 2251/5376; H01L 2924/01063; H01L 21/02178
  See application file for complete search history.

(56) References Cited

U.S. PATENT DOCUMENTS

| 7,579,628 | B2 * | 8/2009 | Inoguchi .......................... 257/81 |
| 2005/0256650 | A1 * | 11/2005 | Labarbe et al. ................. 702/19 |
| 2006/0157724 | A1 * | 7/2006 | Fujita ............................. 257/99 |
| 2006/0170332 | A1 * | 8/2006 | Tamaki et al. ................ 313/498 |
| 2007/0131907 | A1 * | 6/2007 | Hirata et al. ........... 252/301.4 R |
| 2008/0180948 | A1 * | 7/2008 | Yoon et al. .................... 362/230 |
| 2009/0027883 | A1 | 1/2009 | Koike et al. |
| 2010/0123386 | A1 * | 5/2010 | Chen ............................. 313/502 |
| 2012/0056227 | A1 * | 3/2012 | Lee et al. ........................ 257/98 |
| 2012/0104957 | A1 * | 5/2012 | Yano et al. .................... 315/201 |
| 2012/0119234 | A1 * | 5/2012 | Shioi et al. ..................... 257/88 |
| 2012/0153486 | A1 * | 6/2012 | Kuramoto et al. ............ 257/762 |

FOREIGN PATENT DOCUMENTS

| JP | 2005-101023 A | 4/2005 |
| JP | 2007-234632 A | 9/2007 |

* cited by examiner

*Primary Examiner* — Donald Raleigh
(74) *Attorney, Agent, or Firm* — Global IP Counselors, LLP (57) ABSTRACT

A light emitting device includes a substrate including a base member, a plurality of wiring portions disposed on a surface of the base member, a covering portion having openings respectively exposing a part of the wiring portions, a plurality of light emitting elements respectively electrically connected to the wiring portions exposed from the covering portion, and sealing members respectively sealing the light emitting elements. At least a part of the covering portion contains a light-storing material.

26 Claims, 3 Drawing Sheets

LIGHT EMITTING DEVICE

CROSS-REFERENCE TO RELATED APPLICATION

This application claims priority to Japanese Patent Application No. 2012-212114, filed on Sep. 26, 2012. The entire disclosure of Japanese Patent Application No. 2012-212114 is hereby incorporated herein by reference.

BACKGROUND OF THE INVENTION

1. Field of the Invention

The present invention relates to a light emitting device, and more particularly relates to a light emitting device having a light-storing material with afterglow property.

2. Description of the Related Art

Conventionally, in order to obtain an afterglow at the time of OFF-operation, a light-storing material having an afterglow property has been used in a light source employing a light emitting element. For example, there has been proposed a light emitting device in which a reflective member is arranged surrounding a light emitting element arranged on a substrate, and a light-storing material is arranged on a surface of the reflective member. In the light emitting device, the surface of the reflective member has a portion where the light-storing material is arranged and a portion where the light-storing material is not arranged, so that reduction in the optical reflectivity at the time of ON-operation of the light emitting device can be prevented (for example, see Patent Literature 1: JP 2007-234632A).

SUMMARY OF THE INVENTION

The present invention includes the aspects described below.

(1) A light emitting device includes a substrate including a base member, a plurality of wiring portions disposed on a surface of the base member, and a covering portion covering the wiring portions and having openings respectively exposing a part of wiring portions, a plurality of light emitting elements respectively electrically connected to the wiring portions exposed from the covering portion, and sealing members respectively sealing the light emitting elements. At least a part of the covering portion contains a light-storing material.

According to the present invention, a light emitting device can be provided in which uniform light from the light-storing material can be obtained at the time of OFF-operation of the light emitting device, and also the light extraction efficiency can be improved.

DETAILED DESCRIPTION OF EMBODIMENTS

A light emitting device according to the present disclosure includes mainly, a substrate, a light emitting element, and a sealing member.

Substrate

The substrate at least includes a base member, a plurality of wiring portions disposed on one surface of the base member, and a covering layer disposed on the wiring portions. The base member is a basic component of the light emitting device and can be formed by using an appropriate material according to the purpose and applications, and also in view of mounting of the light emitting element, the reflectance, adhesiveness with other members. Examples of such material include an insulating or conductive material such as ceramics (such as $Al_2O_3$ and AlN), glass epoxy, plastic, metal plate, metal foil. More specifically, a resin such as polyethylene terephthalate and polyimide may be preferable. Particularly, in the case where solder is used for mounting light emitting elements, polyimide, which has high heat-resisting property, can be more preferably used. In addition, a material constituting the base member may contain a material having high optical reflectance (for example, a white filler such as titanium oxide). The thickness of the base member is not specifically limited and for example, a thickness of about 10 μm to several mm can be employed. The base member may be rigid or flexible, but a flexible base member is preferable, and in such a case, the thickness of 10 μm to 100 μm can be employed.

The base member can be made with an appropriate shape (size, length) according to the aim and applications. The base member substantially defines the shape of the substrate, and the example of the shape include a quadrangular shape, a rectangular shape, a polygonal shape, a circular shape, an elliptical shape, or a shape which is a combination of these shapes. In the case where the light emitting device according to an embodiment of the present invention is used for straight tube-type lamps, an elongated shape extending in the longitudinal direction can be preferably employed. For example, the ratio in the longitudinal direction to the lateral direction can be about 5:1 to 50:1, which can be about 10:1 to 30:1 and further preferably can be about 10:1 to 20:1. A flexible base member can be used in a deformed state such as in a curved or bent state. Therefore, the flexible base member having a width and length several mm to several cm greater than the width and length of corresponding straight tube-type lighting can be used. More specifically, for a straight tube-type lamp with a length of about 120 cm, a base member having a width of 0.5 cm to 5 cm and a length of 30 cm to 120 cm can be employed. Also, a flexible base member can be manufactured by using roll-to-roll method, in which several units of such an elongated base member (substrate) can be processed together. In this case, sprocket holes may be provided in the base member.

The plurality of wiring portions are formed as electrically conductive members, disposed on one surface of the base member and directly or indirectly connected to the light emitting element. The wiring portions can be made of, for example, an electrically conductive thin layer of single-layer or stacked-layer structure of metal such as gold, silver, copper and/or aluminum or alloy thereof. The wiring portion may be arranged not only on a single surface of the base member, but also an inner side or on another surface of the substrate according to the type of the substrate. The thickness of the wiring portion is not specifically limited and an appropriate thickness employed for substrates generally used in the art can be applied. For example, a thickness of about several μm to several mm can be employed. Particularly, in the case where a flexible base member is used as described above, the wiring portions preferably have a thickness which would not impair the flexibility, and for example, a thickness of about 8 μm to 150 μm can be employed.

The shape (pattern) of the plurality of wiring portions is not specifically limited, and generally, a similar shape or a shape conforming to the shape or pattern of the wiring of the substrate for mounting the light emitting element, or with further consideration of heat dissipation and/or mechanical strength can be preferably employed. For example, a polygonal shape such as a crank shape, a triangular shape, and a quadrangular shape, a shape with no sharp corners such as a circular shape and an elliptical shape, and a shape of those with partially irregular shape can be employed singly or in combination. The corners of the wiring portions are preferably rounded.

The plurality of wiring portions are arranged spaced apart from each other. Such terminal portions are made up of a pair of positive and negative terminals, and the number of the wiring portions which constitute the pair of the terminals is not specifically limited. For example, each of the pair of wiring portions may be made up of a single wiring portion or a plurality of wiring portions.

Arranging the wiring portions in a relatively large area with a combination of wiring portions having various shapes can increase the degree of freedom in arrangement of the light emitting device. For example, with a rectangular base member, it can be possible that six light emitting elements are arranged three in the longitudinal direction and two in the lateral direction as one block and connected in parallel, then, twelve blocks are arranged in the longitudinal direction and connected in series by the pair of positive and negative wiring portions. The base member may have an approximately square shape, an approximately circular shape, or an approximately ellipsoidal shape, and one light emitting element may be connected to ordinary, positive and negative wiring portions respectively.

In addition to the wiring portions directly or indirectly electrically connected to corresponding light emitting elements (that is, the wiring portions for providing electrical continuity), a wiring portion which has a similar shape or a different shape and does not contribute to conduction of electricity and may also be arranged. The wiring portion which does not contribute to providing electrical continuity can serve as a heat releasing member or a mounting portion for the light emitting element. For example, in the case where the base member has an elongated shape extended in the longitudinal direction, the wiring portions which do not contribute to providing electrical continuity are preferably arranged extended to the longitudinal end portions and at the both sides of the wiring portions in the lateral direction. The wiring portions preferably have terminals which respectively allow supply of electricity to the wiring portions. This arrangement allows supply of electricity to light emitting elements from external power source. In the case where a part of such wiring portions are arranged on approximately the entire surface of the flexible base member (preferably arranged without having a gap), stress due to bending of the substrate etc., loaded on the light emitting elements and the sealing member to be described later can be reduced. More specifically, in the case where a base member of elongated shape is used, the wiring portions are preferably arranged elongated along the longitudinal direction of the base member, and more preferably, the wiring portions are arranged with a length of ⅓ to 1 of the longitudinal length of the base member.

As described above. on one surface of the base member, the plurality of wiring portions are spaced apart from each other and the separation creates grooves where the wiring portions are not disposed (in other words, portions where the base member is exposed). The grooves are arranged between the wiring portions, so that the shapes of the grooves are in conformity to the shapes of the wiring portions, which may be, for example, a crank shape. The width of the grooves is preferably narrower than the width of the wiring portions, in other words, the wiring portions can be disposed with a larger area, and for example, a width of about 0.05 mm to 5 mm can be employed.

The wiring portions (both wiring portions contribute/not contribute to electrical continuity) are preferably arranged on the base member respectively with the largest possible area, so that heat dissipation can be improved. Further, in the case where the a flexible substrate is used, because the wiring portions are arranged on the whole area of one surface of the base member with relatively large areas, appropriate strength can be added while maintaining its flexibility. Thus, disconnection of wiring portions and breakage of substrate due to bending of the flexible substrate can be prevented effectively. More specifically, with respect to the area of the base member, the wiring portions are arranged with an area preferably 50% or greater, more preferably 70% or greater, further preferably 80% or greater, 85% or greater, or 90% or greater. Also, in the case where electrical isolation is needed between the wiring portions, in order to secure the isolation, the wiring portions are preferably disposed with the areas of about 98% or less, or 95% or less.

The covering portion which covers the wiring portions preferably can serve as a reflective layer to reflect the light emitted from the light emitting element. It is preferable that the covering portion has, as described later, an opening where the wiring portions are exposed, and except for the opening, the covering portion covers approximately the entire surface of the substrate. In addition, it is preferable that the covering portion also covers the grooves between the wiring portions.

In order to connect the light emitting element with a pair of positive and negative wiring portions, the opening is arranged to expose the wiring portions. The shape and size of the opening is not specifically limited, but a minimum size sufficient for electrical connection of the light emitting element with the wiring portions is preferable. The number of the openings provided for one substrate is not specifically limited and for example, appropriately determined according to the number of the light emitting elements to be mounted on one substrate.

Generally, the number and arrangement of light emitting elements are adjusted according to the output power, light distribution, or the like, and accordingly, the number and the positions of the openings are determined. The number of the openings can either be the same or different with respect to the number of the light emitting elements to be mounted. For example, in the case where twenty light emitting elements to be mounted with one light emitting element in one opening, 20 openings can be arranged in the covering portion. Or in the case where two or more light emitting elements to be mounted in one opening, 10 or less openings can be arranged. In some cases, the light emitting elements may not be mounted in the openings. For example, in the case where the light emitting devices are manufactured in several ranks (for example, light emitting devices of different outputs), with the use of a common substrate (that is, the number and arrangement of the openings provided in the covering layer), different optical output can be obtained by changing the number of the light emitting elements to be mounted in the openings. In this case, some openings may not have any light emitting elements mounted therein. A region lacking the covering portion (i.e. an opening) may be formed in a region for arranging a member or the like, such as the terminal described above, which supplies electricity to the light emitting elements. In the case of flip-chip mounting, a part of groove is preferably exposed in a single opening.

At least a part of the covering portion contains a light-storing material. It is preferable that the covering portion contains or is made of a material which reflects emission of the light emitting element and wavelength-converted light by a wavelength converting member to be described later. Examples of the materials include a resin such as a phenol resin, an epoxy resin, an acrylic resin, a BT resin, a PPA, a silicone resin and a urea resin. The covering portion may be either of a single layer structure or a stacked layer structure. Particularly, in the case where a single layer structure is employed, the light-storing material is preferably contained or dispersed uniformly in the entire covering potion. In the case where a stacked layer structure is employed, a layer containing a light-storing material is preferably arranged on the top surface of the stacked layer structure. Also, from the top surface side, the layer containing the light-storing material, and a layer in which the reflectance is enhanced (i.e. a layer having light reflectivity) by filling a filler or the like are preferably stacked in this order. With this arrangement, light from the light-storing material is prevented from being absorbed by the wiring portions and the light extracting efficiency can be improved. The layer containing the light-storing material at the top surface may be arranged on the entire surface of the covering portion, or may be disposed partially on the covering portion with a shape of protrusions in various arrangements such as in island shapes, in stripes, or in a grid. That is, the top view of the protrusions may have any shapes such as a polygon such as a rectangle, square, or circle or ellipse.

The light-storing material may be any known materials in the art, examples of which include, sulfide-based fluorescent materials, aluminate-based fluorescent materials, and oxysulfide-based fluorescent materials. More specific examples include fluorescent materials such as that described in JP 2005-330469A. Those can be used singly or in combination of two or more. Among those, aluminate-based fluorescent materials, particularly $Sr_4Al_{16}O_{25}$:Eu,Dy (SAE) is preferable. The light-storing material is preferably contained in a range of 5 to 60 wt % in a material constituting the covering portion. Also, the covering portion may include a filler such as $SiO_2$, $TiO_2$, $Al_2O_3$, $ZrO_2$, or MgO, for example. The covering portion can be fixed in such a manner that, for example, a light-storing material is mixed in the resin described above and the mixture is printed on the wiring portions by using a screen printer etc., and then heated to cure. Or a resin mixed with a light-storing material can be processed into a sheet shape and applied on the wiring portions via an adhesive. The sheet can be formed by any method known in the art such as extrusion molding, injection molding, or compression molding. Also, in the case of obtaining a stacked layer structure, various methods can be employed such as, a method in which a layer made of the resin described above is formed and then a solution or a polymer solution which contains the light-storing material is applied on the layer, a method in which a polymer solution containing the resin and the light-storing material described above is coextruded, a method in which on the layer made of the resin described above, a polymer solution containing a light-storing material is applied on the entire surface or a part of the surface by using printing technique, or a method in which a resin containing a light-storing material and having a processed shape (for example, a sheet shape) is attached.

The covering portion is preferably disposed with a relatively small thickness, and particularly preferable that the covering portion is disposed so that the upper surface of the light emitting element is higher than the covering portion. More specifically, the thickness of the covering portion can be about 0.01 mm to 0.1 mm regardless of a single layer structure or a stacked layer structure.

The substrate having such a structure preferably has flexibility. This arrangement allows its use in various applications, with in situ shape with the light emitting element mounted thereon or with a shape appropriately changed. The total thickness of the substrate can be adjusted according to the thickness of each of the components described above, and for example, about 0.05 to 0.15 mm, preferably 0.07 to 0.12 mm can be employed.

In the case where the light-storing material is arranged partially on the covering portion, in order to enhance the light-storing efficiency, the light-storing material is preferably disposed so that the light-storing material also presents at higher locations than the upper surface of the light emitting elements, but at lower locations than the upper surface (the top surface at top point) of the sealing member which to be described later. With this arrangement, the light from the light emitting elements can be irradiated efficiently on the light-storing material and also optical loss caused by absorption of light from the fluorescent material by the light-storing material can be avoided.

Light Emitting Element

A plurality of light emitting elements are arranged on the substrate, with electrically connected to the wiring portions which are exposed from the covering portion. Particularly, in the above-described openings of the covering layer on the substrate, the light emitting elements are preferably arranged respectively on the two wiring portions in a bridged manner or arranged on a single wiring portion. With such arrangements, the light emitting elements can be electrically connected easily to the pair of positive and negative wiring portions respectively. The number and/or tone of color tone and/or arrangement of a plurality of light emitting elements are determined to satisfy the output and light distribution designed for the light emitting device. It is therefore accordingly the shape and arrangement of the wiring portions and/or openings of the covering portion are adjusted and the light emitting elements are mounted at the determined positions.

The light emitting element includes a semiconductor structure, a p-side electrode, and an n-side electrode. The semiconductor structure, for example, includes an n-type layer, an active layer, and a p-type layer respectively made of a gallium nitride-based semiconductor and stacked in the order on a light-transmissive sapphire substrate. It is not limited to gallium nitride-system semiconductors, a II-IV system semiconductor or a III-V system semiconductor may be used. The n-side electrode and the p-side electrode can be formed with a single layer or staked-layer of known materials.

The light emitting element may be mounted in the substrate in a flip-chip manner or a face-up manner. In the case of flip-chip mounting, the p-side electrode and the n-side electrode of the light emitting element are connected to a pair of wiring portions via a pair of bonding member respectively. For the bonding member, for example, a solder of Sn—Ag—Cu system, Sn—Cu system, or an Au—Sn system, or a metal bump such as Au can be used. In the case of face-up mounting, the light emitting element is fixed on the base member (on the wiring portion) by an insulating bonding member such as a resin or by an electrically conductive bonding member as described above, and then, electrically connected to the wiring portions via wires. In the case where the substrate of the light emitting element is electrically conductive, the light emitting element is electrically connected by the bonding member as described above.

In the light emitting device according to the embodiments of the present invention, the light emitting elements are arranged so as to be directly electrically connected to the wiring portions of the substrate, so that light of wide distribution from the sealing member which to be described later can be irradiated on the light-storing material of the covering portion which is a constituent of the substrate. With this arrangement, regardless of the locations of the light-storing material on the covering portion, afterglow having less color unevenness can be obtained. Also, the light-storing material can be disposed in proximity to the wiring portions, which can improve heat dissipation and deterioration of the light-storing material can be prevented.

In addition to the light emitting element, a protective element such as a Zener diode or a bridge diode, or related components (for example, a terminal for external connection described above, a fuse, and/or a resistance) may be arranged on one surface of the substrate. Such a protective element and related component may be arranged together with the light emitting element in the opening where the light emitting element is mounted or in a different opening provided for them. But, they are preferably arranged at locations so as not to absorb the light from the light emitting element. The protective element is preferably arranged at an appropriate position, for example, one protective element is mounted on a wiring portion, to which a plurality of light emitting elements are connected in series, at a position near a connector regardless of the arrangement of the light emitting elements.

Sealing Member

The sealing member seals (covers) each light emitting element on the substrate. One light emitting element is preferably covered with one sealing member, but two or more light emitting elements may be enclosed by one sealing member. The sealing member preferably has transparency to the light from the light emitting element and light resistance and electrical insulation properties. The sealing member may be arranged to cover all the openings of the covering portion described above, or not to cover some of the openings. In the specification, the term "transparency to light" means properties of transmitting about 60% or greater emission of the light emitting element, more preferably 70% or greater or 80% or greater of light emitted from the light emitting element.

The sealing member can be formed for example by using a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins.

The sealing member preferably includes a wavelength converting member such as a fluorescent material capable of absorbing light from the light emitting element and emitting light of different wavelength. Examples of such a wavelength converting member include an oxide-based fluorescent material, a sulfide-based fluorescent material, and a nitride-based fluorescent material. For example, in the case where a gallium nitride based light emitting element to emit blue light is used as the light emitting element, fluorescent materials to absorb blue light, such as a YAG-based fluorescent material or a LAG-based fluorescent material to emit yellow to green light, a SiAlON-based fluorescent material to emit green light, and a SCASN-based fluorescent material and a CASN-based fluorescent material to emit red light, are preferably used singly or in combination. Particularly, for the light emitting devices used for the display devices such as backlights of liquid crystal displays and TV-screens, a SiAlON fluorescent material and a SCASN fluorescent material are preferably used in combination. Also, for lighting applications, a YAG-based fluorescent material or a LAG-based fluorescent material and a SCASN-based fluorescent material or a CASN-based fluorescent material are preferably used in combination.

In the specification, the fluorescent material preferably has an emission peak wavelength longer than that of the light-storing material. For example, in the case where an aluminate-based fluorescent material, particularly $Sr_4Al_{16}O_{25}$:Eu, Dy (SAE) is used as the light-storing material, at least one kind of fluorescent material which can be excited by at least a part of light from the SAE and emits light having a higher luminosity factor than the luminosity factor of the light from the SAE is preferably used.

A luminosity factor which is also called as a luminous efficiency function is a measure of the average spectral sensitivity of human visual perception of brightness. Light at the wavelength 555 nm, to which human eye is most sensitive, is indicated as 1 and brightness of other wavelength are expressed as a proportion to the light at 555 nm. The CIE averaged the spectral sensitivity of the eyes of sizable subjects and defined the standard luminosity function (relative luminous efficiency), to which the present specification refers. Although the luminosity factor takes account of photopic vision and scotopic vision, the present specification refers photopic luminous factor which is a representation of visual sensitivity of the human eye under well-lit conditions. The term "light of higher luminosity factor than light from SAE" refers to light in a wavelength range (about 495 to 635 nm) which allows higher luminosity factors than the luminosity factor (about 0.25) at the peak wavelength (about 495 nm) of SAE. Examples of such light include light in yellow to red region which have higher luminosity factors than the light with the emission peak wavelength of SAE. Examples of the fluorescent materials which can emit such light include YAG-based fluorescent materials, CASN-based fluorescent materials and combinations of those.

Thus, excitation efficiency of the fluorescent materials can be improved and a good average color rendering index Ra can be obtained. In the specification, the term "average color rendering index Ra" refers to the values shown in WO2004081140 A1 and the term "a good Ra" means the value of about 75 to 95. That is, the light-storing material does not present in the opening of the covering portion. The fluorescent material in the sealing member around the openings is excited by light emitted from SAE and converts it into the light of higher luminosity factor than the light of SAE. Therefore, at the time of OFF-operation of the light emitting device, at the openings where the light-storing material is not arranged, the incident light from the light-storing material (afterglow) and light from the fluorescent material excited by the afterglow are added, thus the light (afterglow) can be exhibited more significantly and in the larger area.

It is preferable that the fluorescent material used in the sealing member can emit light in yellow region. With this arrangement, in the case where SAE is used as the light-storing material, the light from the SAE can be converted into light with a good luminosity factor, so that greater human visual perception of afterglow can be achieved. That is, with the use of a fluorescent material which can emit light in yellow region, even when a small amount of light from the light emitting element is absorbed by SAE, the absorbed amount can be compensated or added.

The sealing member may contain a light diffusing agent (barium sulfate, titanium oxide, aluminum oxide, silicon oxide, etc). In addition, it is preferable that a light-storing material is not contained in the sealing member. With this arrangement, a light-storing material is not placed between the light emitting element and the fluorescent material in the sealing member, so that all light from the light emitting element can be irradiated on the fluorescent material. Thus, the light from the light emitting element can be prevented from being irradiated on the light-storing material and absorbed by the light-storing material, consequently excitation efficiency can be further improved. More specifically, in the case where the light emitting element emits light in blue region, the light can be converted into a light in blue-green region by the light-storing material (e.g. SAE), and further, the converted light can be emitted on the fluorescent material, which results in a decrease in the excitation efficiency. Such a decrease in the excitation efficiency in the fluorescent material can be securely avoided.

The shape of the sealing member is not specifically limited, but in view of light luminous intensity distribution and directivity of the light emitted from the light emitting element, a concave lens shape or a convex lens shape is preferably employed. Of those, a hemispherical convex lens shape may be most suitably employed.

The size of the sealing member is not specifically limited and appropriately adjusted in view of the brightness, directivity, etc., of the light emitting device. Particularly, the sealing member preferably has a size which can secure wider contact area with the first resin member, but in the case where a flexible substrate is employed, a size which does not impair the flexibility of the flexible substrate is preferable. For example, the size which allows completely covering the light emitting element or greater and more preferably has a diameter or length of about twice or less of the length of a side of the light emitting element. More specifically, a side (or diameter) of about 1 mm to 4 mm can be employed.

The sealing member may be disposed with its outer periphery arranged on the covering portion, or in the opening of the covering portion. In the case where the outer edge of the sealing member is arranged on the covering portion, the above-described light-storing material can be contained in the covering portion in such a manner that it can be dispersed in the portion below the sealing member to an outer side of the sealing member, or it can be contained in a protrusion at the surface of the covering portion which is arranged between the sealing members. In the case where the sealing member is disposed in the opening of the covering portion, the outer periphery of the sealing member is preferably in contact with (adhered to) the opening edge of the covering portion. That is, on the surface of the light emitting device, the fluorescent material and the light-storing material are arranged without leaving a gap. With this arrangement, uneven brightness of afterglow can be reduced even at the time of OFF-operation of the light emitting device.

As long as covering the light emitting element, the sealing member may not be directly in contact with the light emitting element and may have a space between the light emitting element, or the sealing member is arranged so that over the light emitting element, it contacts the light emitting element, but at the outer periphery of the light emitting element, it is not necessarily directly in contact with the covering portion which constitutes the substrate and with the wiring portions, and disposed via the resin layer to be described later.

Resin Layer

A resin layer is preferably disposed at periphery of the light emitting elements. Particularly, in the case where the light emitting elements are arranged in the openings of the covering portion, the resin layer is preferably disposed at the periphery of the light emitting elements and covering the exposed wiring portions. As long as it is disposed in the opening provided in the covering portion, the resin layer may be disposed on the outer periphery of the opening of the covering portion, that is, the resin layer may be disposed extending onto the covering layer, or regardless of the presence of the wiring portions, for example, the resin layer may be disposed in the groove between the wiring portions and/or directly under the light emitting element.

The resin layer is preferably in contact with the outer edge (side surfaces) of the light emitting element. Generally, the light emitting element is mounted on the substrate by using a bonding member etc., but a part of the surfaces of the bonding member and/or the base member (for example, the wiring portions etc.,) generally tends to develop deterioration due to light than in the material of the resin layer. For this reason, the resin layer is preferably arranged so that in the vicinity of the light emitting element, a part of the surface etc., of the bonding member and/or the base member is covered with the resin layer. With this arrangement, the relatively intense light emitted from the light emitting element can be prevented from directly irradiating the bonding member and/or the base member, so that optical degradation of the constituent members of the light emitting device can be efficiently prevented.

The end portion of the resin layer at the opposite side of the light emitting element may be located either at an inner side of the outer edge, in conformity to the outer edge, or at an outer side of the outer edge of the sealing member described above. Particularly, in the case where the resin layer is arranged at an outer side of the outer edge, the contact area between the resin layer and the sealing member can be easily and securely obtained, so that the sealing member can be adhered more tightly to the light emitting device, particularly to the resin layer.

In other words, the size of the resin layer, that is, the planar dimension of the light emitting device in light extracting direction may be similar, larger, or smaller than the planar dimension of the sealing resin member, excluding the planar dimension of the light emitting element. Particularly, the size of the first resin member may be about ⅕ to 3 times, preferably about ¼ to 3 times, and more preferably ⅓ to 1.5 times of the planar dimension of the sealing resin member excluding the planar dimension of the light emitting element. Thus, with a large planar dimension of the resin layer, the contact area with the sealing member increases as described later, so that due to the adhesion of both, the adhesion of the sealing member of the light emitting device can be further enhanced.

The resin layer may be disposed, for example, with a thickness in a range of several μm to several hundred μm. Particularly, portions in contact with the light emitting element preferably have a thickness corresponding to or less than the height of the side surfaces of the light emitting element. In the case where the resin layer is disposed in the whole portion of the opening, the portion in contact with the outer periphery of the opening preferably has a thickness not exceeding the depth of the opening. Particularly preferably the thickness of the resin layer decreases from the light emitting element outward (outer side with respect to the canter of the light emitting element).

The resin layer can be formed for example by using a resin having its base polymer of, a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins. Of those, a resin containing a silicone resin and/or an epoxy resin as its base polymer is preferable. In the specification, the term "a base polymer" means a resin having a highest content of the materials constituting the resin layer. The underfill preferably contains, for example, a reflective material and/or diffusion material such as $SiO_2$, $TiO_2$, $Al_2O_3$, $ZrO_2$, and MgO. With this arrangement, light can be reflected sufficiently. The resin layer may be made of a single material or a combination of two or more materials. With this arrangement, the reflectance of light can be adjusted and also the linear expansion coefficient of the resin can be adjusted. The material of the resin layer preferably includes the material constituting the sealing member. It is particularly more preferable to include the same resin which constitutes the sealing member, and further preferable to include the base polymer which constitutes the sealing member as the base polymer of its material. With this arrangement, adhesion of the sealing member can be further secured.

In the light emitting device according to the embodiments of the present invention, at the time of ON-operation, approximately all the light emitted from the light emitting elements is irradiated on the sealing members. Particularly, in the case where the fluorescent material is contained in the sealing member, light emitted from the light emitting elements is irradiated on the fluorescent material, so that the fluorescent material can be excited efficiently and absorption of light by the light storing material can be avoided. At the time of Off-operation, the path of afterglow, which is emitted from the light storing material, incident on the fluorescent material in the sealing member can be minimized, so that absorption or confinement of afterglow by the fluorescent material can be prevented, and thus intensity of afterglow can be improved.

The light emitting device of the present invention can be utilized for various type of light source such as light sources for lighting, light sources for various types of indicators, in-car light sources, display light sources, light sources for sensors, traffic lights, in-car products, channel letter for sign and the like.

Embodiments of the light emitting devices according to the present invention will be described below with reference to the drawings.

Embodiment 1

Figure 1A:
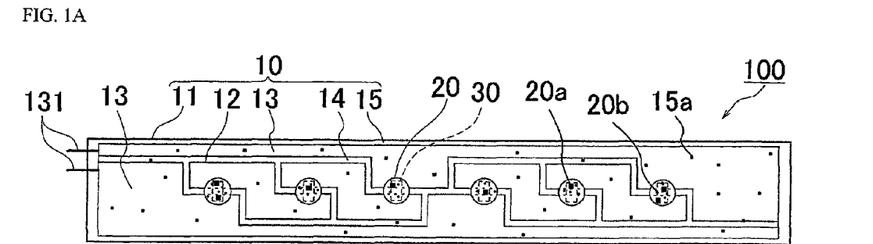
FIG. 1A is a schematic plan view showing an embodiment of a light emitting device according to the present invention.
Figure 1B:
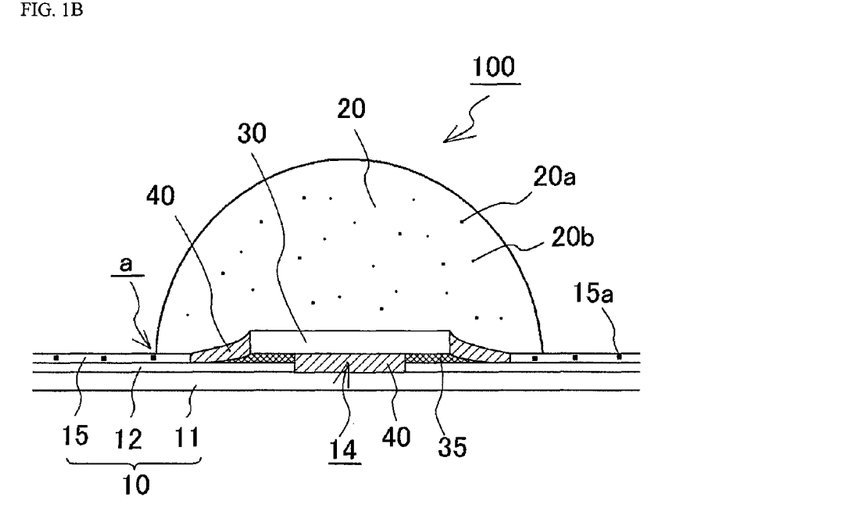
FIG. 1B is a schematic cross-sectional view of the light emitting device shown in FIG. 1A.

The light emitting device 100 according to Embodiment 1 includes, as shown in FIG. 1A and FIG. 1B, the substrate 10, the light emitting elements 30 arranged on the surface of the substrate 10, and the sealing members 20 which are disposed on the substrate 10 and cover the respective light emitting elements 30.

The substrate 10 includes the flexible base member 11 made of a polyimide (about 25 μm thickness), a plurality of wiring portions 12 (copper foil, about 35 μm thickness) arranged on one surface of the base member 11 via an adhesive agent and spaced apart from each other by a groove portion 14, and a single layer of an insulating covering portion 15 which is disposed over them. The covering portion 15 is made of a silicone-based resin containing titanium oxide, which contains about 10 wt % of SAE as the light-storing material 15a, and is formed in a layer-shape with a thickness of about 15 μm. Of the wiring portions 12, the wiring portion 13 extending approximately the entire length in the longitudinal direction is connected to the terminal 131 which allows supply of electricity to the wiring portion 12. The substrate 10 has dimensions of 1141 mm (length)×15 mm (width)×0.09 mm (thickness). In order to establish electrical connection with the light emitting element 30, a groove portion 14 between the wiring portions 12 and the wiring portion 12 are exposed from the covering portion 15 in a region of the substrate 10. The wiring portions 12 respectively have a crank shape and the groove has a width of about 0.3 mm.

The light emitting element 30 includes a semiconductor structure, a p-side electrode, and an n-side electrode (not shown). In the semiconductor structure, the p-type semiconductor layer and the light emitting layer are partially removed to expose the n-type semiconductor layer, and an n-side electrode is formed on the exposed surface. A p-side electrode is formed on the upper surface of the p-type semiconductor layer. Thus, the n-side electrode and the p-side electrode are formed on the same surface side with respect to the semiconductor structure. The light emitting element 30 as described above is arranged on a pair of the wiring portions 12 which are exposed from the covering portion 15 of the substrate 10, with the surface having the n-side electrode and the p-side electrode facing downward, and is electrically connected to the wiring portions via the bonding member 35. A total of six units of the light emitting elements 30 are arranged linearly with uniform intervals.

The resin layer 40 is arranged on the surface of the substrate 10 at a periphery of the region where the light emitting element 30 is disposed. The resin layer 40 is, for example, made of a silicone resin containing about 30 weight % of titanium oxide. The resin layer 40 is arranged from the outer periphery of the light emitting element 30 and on the bonding member 35 to the peripheral region of the light emitting element, in the opening of the covering portion 15. The thickness of the resin layer 40 can be approximately the same as the height of the light emitting element 30 at the light emitting element 30 side, and can be gradually reduced on the bonding member 35 to about the same thickness as the covering portion 15 at the contact surface with the covering portion 15.

As described above, the resin layer 40 is arranged at the outer periphery of the light emitting element 30 with a relatively large area, the sealing member 20 can be in contact with the resin layer 40 at a larger contact area. As a result, the sealing member 20 can be firmly adhered to the substrate 10. Further, the resin layer 40 has a reflectance higher than that of the bonding member 35 and the wiring portion 12, so that extraction of light from the light emitting element can be performed more efficiently.

The sealing member 20 is disposed on the substrate 10 mounted with the light emitting element 30, on the portions including the light emitting element 30, the resin layer 40 arranged around the light emitting element 30, and a portion of the covering portion 15 disposed from directly under the resin layer 40 on the covering portion 15 arranged on an outer side of the light emitting element 30. The sealing member 20 is, for example, formed with a silicone resin which contains a total of about 10 wt % of LAG and SCASN as the fluorescent materials 20a and 20b. That is, the sealing member 20 contains the same type of polymer used to make the resin layer.

The outer periphery a of the sealing member 20 is arranged on the covering portion 15 of the substrate 10. The sealing member 20 is formed in a hemispherical shape by potting etc. The diameter of the sealing member 20 is, for example, about 3.5 mm. The sealing member 20 is disposed containing the same base polymer as in the resin layer 40, thus, the adhesion between the both can be secured. Particularly, in the light emitting device 100, the resin layer 40 and the sealing member 20 are in contact with each other with the entire surface of the resin layer 40 and all the side surfaces of the resin layer 40 arranged on the covering portion 15, and thus, a further contact area between the resin layer 40 and the sealing member 20 can be secured. Moreover, the resin layer 40 and the sealing member 20 are arranged with containing the same base polymer, so that good suitability and compatibility therebetween can be obtained and thus further firm adhesion can be realized. Moreover, the surfaces and the interface between the bonding member 35 and the wiring portion 12 and the interface between the wiring portion 12 and the reflective layer (covering portion 15) can be covered with the resin layer 40, so that optical degradation of those members and detachment or the like, due to the optical degradation can be effectively prevented.

In the light emitting device according to the embodiments of the present invention, at the time of ON-operation, the light emitted from the light emitting elements is irradiated on the sealing members, so that the emitted light can be efficiently irradiated on the fluorescent material which is contained in the sealing member. With this arrangement, the fluorescent material can be excited efficiently and absorption of light by the light storing material can be approximately avoided. In addition, in the light emitting device according to embodiments of the present invention, the light emitting elements are arranged so as to be directly electrically connected to the wiring portions of the substrate. Thus, light of wide distribution can be efficiently irradiated from the sealing member on the light-storing material of the covering portion to efficiently excite the light-storing material. Thus, together with the excitation of the fluorescent material in the sealing member, the color rendering properties can be improved and also storage of light can be achieved. Also, the light-storing material is arranged in proximity to the wiring portions, so that preferable heat dissipation can be achieved during the irradiation of the light, and thus deterioration of the light-storing material can be prevented.

At the time of Off-operation, the path of afterglow, which is emitted from the light storing material, incident on the fluorescent material in the sealing member can be minimized. That is, the outer edge of the sealing member is arranged only a small part of the portions where the light-storing material of the covering member is arranged, so that absorption or confinement of afterglow by the fluorescent material can be prevented, and thus intensity of afterglow can be improved. Also, on the surface of the light emitting device, the light-storing material is arranged without leaving a gap, so that generally uniform afterglow can be obtained with wider light distribution.

Moreover, the light-storing material is arranged over the reflective covering portion 15, so that light emitted from the light-storing material can be extracted efficiently. In addition, the fluorescent material in the sealing member is a LAG-based fluorescent material which absorbs blue light and emits light in yellow to green region, so that light of SAE which is a light-storing material can be converted into with a good luminosity factor, which can provide greater human visual perception of afterglow, and even in the case where light from the light emitting elements is absorbed by SAE, the absorbed amount can be compensated or added.

In addition, the sealing member does not contain the light-storing material, so that all light from the light emitting element can be irradiated on the fluorescent material. Thus, the light from the light emitting element can be prevented from being irradiated on the light-storing material and absorbed by the light-storing material, so that excitation efficiency can be further improved.

Embodiment 2

Figure 2:
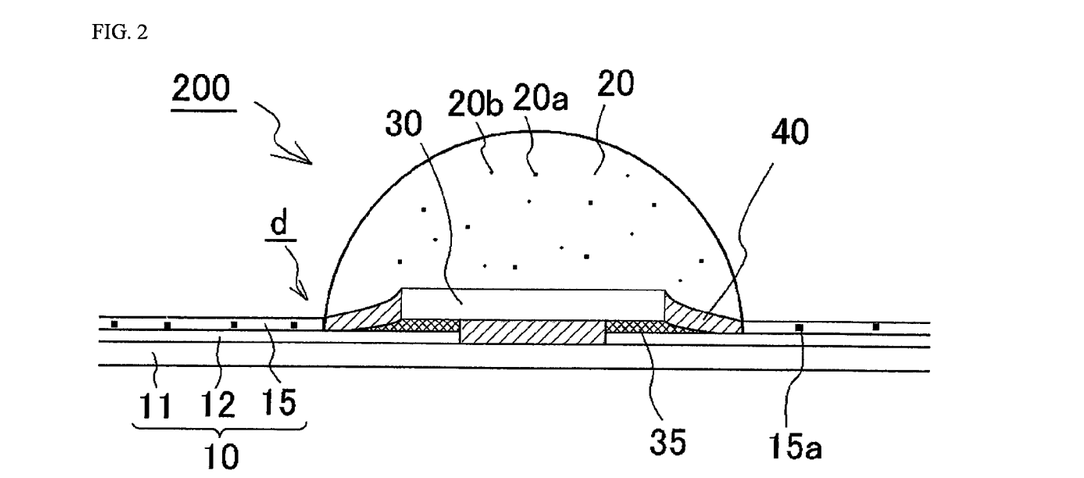
FIG. 2 is a schematic cross-sectional view showing another embodiment of a light emitting device according to the present invention.

The light emitting device 200 according to Embodiment 2 has a substantially similar structure as in the light emitting device 100 except that, for example as shown in FIG. 2, the outer edge of the sealing member 20 is in conformity to the opening edge of the covering portion 15 of the substrate 10, and accordingly, the light-storing material 15a and the fluorescent material 20a and 20b in the sealing member 20 are arranged without leaving a gap. The light emitting device 200 exhibits the same level of effects as that with the light emitting device 100 of Embodiment 1. Particularly, at the time of ON-operation, all the light emitted from the light emitting elements is irradiated on the sealing members and is not directly irradiated on the light-storing material, so that absorption of light by the light storing material can be avoided and the fluorescent material can be excited more efficiently.

Embodiment 3

Figure 3:
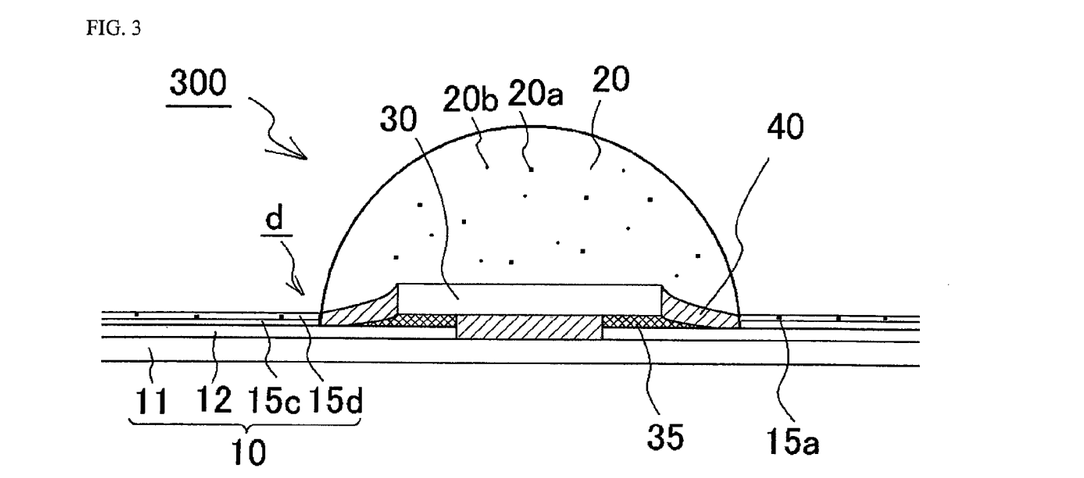
FIG. 3 is a schematic cross-sectional view showing still another embodiment of a light emitting device according to the present invention.

The light emitting device 300 according to Embodiment 3 has a substantially similar structure as in the light emitting device 200 except that, for example as shown in FIG. 3, the covering portion is formed with a stacked-layer structure in which on the resin layer 15c (15 µm in thickness) made of a silicone resin which contains $TiO_2$, a light-storing material layer 15d (15 µm in thickness) made of a silicone resin containing 10 wt % of a light-storing material 15a. The light emitting device 300 exhibits the same level of effects as that with the light emitting device 200 of Embodiment 2. Particularly, in the covering portion, the light-storing material is concentrated on the surface where the light is irradiated, so that the effects described above can be exerted more efficiently. Moreover, the light-storing material is arranged on the resin layer 15c which has optical reflectivity, so that light emitted from the light-storing material can be used effectively.

Embodiment 4

Figure 4A:
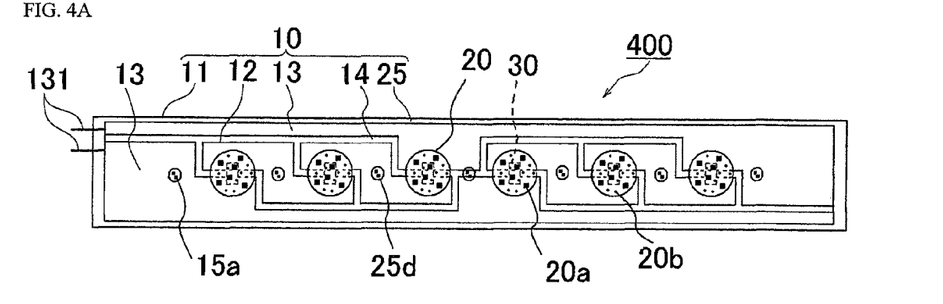
FIG. 4A is a schematic plan view showing a light emitting device according to still another embodiment of the present invention.
Figure 4B:
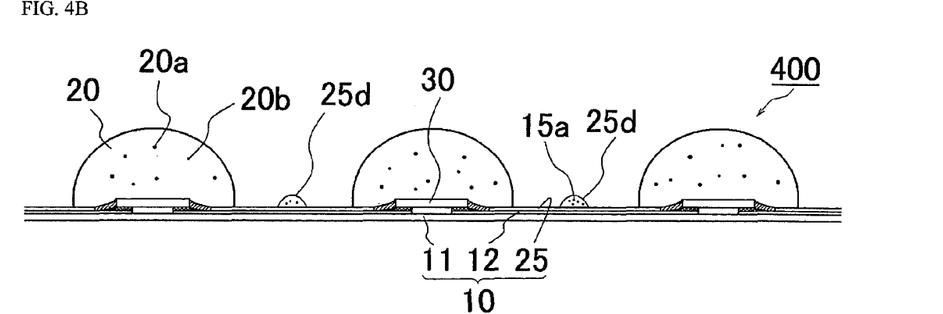
FIG. 4B is a schematic cross-sectional view showing the light emitting device in FIG. 4A according to still another embodiment of the present invention.

The light emitting device 400 according to Embodiment 4 has a substantially similar structure as in the light emitting device 100 except that, for example as shown in FIGS. 4A and 4B, the covering portion 25 is formed with a sheet made of a polyimide and a light-storing material layer 25d disposed on the sheet and has a protrusion shape, which is formed by, using a print-coating technique, partially applying a polymer solution made of a silicone resin which contains 10 wt % of the light-storing material 15a on the sheet between the sealing members 20. With the light emitting device 400, similar effects as described above can be exerted. The light-storing material layer which constitutes a part of the covering portion 25 can also be formed by using potting technique etc., other than by using print-coating technique. As described above, a partial arrangement of the light-storing material layer can extend the degree of freedom in the design and allows a reduction in the production cost. Also, the light-storing material layer 25d is made in a protrusion shape with its top portion being higher than the upper surface of the light emitting element, thus, distribution of light emitted from the light-storing material can be widened.

Embodiment 5

Figure 5:
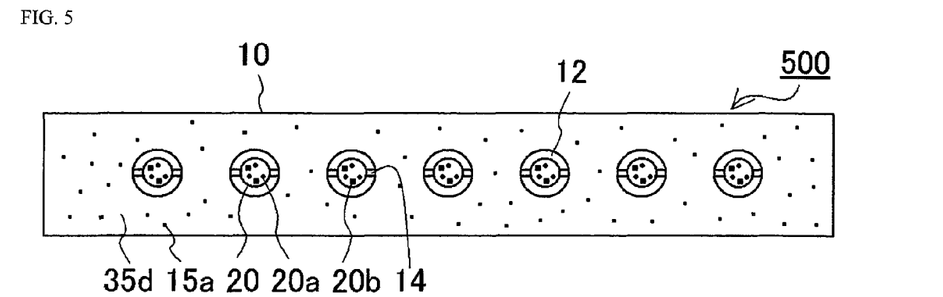
FIG. 5 is a schematic plan view showing a light emitting device according to still another embodiment of the present invention.

The light emitting device 500 according to Embodiment 5 has substantially similar structure as in the light emitting device 400 except that, for example as shown in FIG. 5, the covering portion is integrally formed (the light-storing material layer 35d is adhered on the sheet) with a sheet made of a polyimide and a sheet-shaped light-storing material layer 35d made of a silicone resin which contains 10 wt % of light-storing material 15a which is disposed on the sheet and all surfaces except for the outer peripheral region of the sealing member 20. With the light emitting device 500, similar effects as described above can be exerted. The light-storing material layer can be formed not only by attaching the sheet but also by printing or the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
a substrate including a base member, a plurality of wiring portions disposed on a surface of the base member, and a covering portion partially covering the wiring portions such that a part of the wiring portions is not covered by the covering portion;
a plurality of light emitting elements respectively electrically connected to the wiring portions not covered by the covering portion; and
sealing members respectively sealing the light emitting elements,
wherein at least a part of the covering portion contains a light-storing material that emits afterglow when the light emitting device is turned off, and
the covering portion does not contact the light emitting elements.

2. The light emitting device according to claim 1, wherein the light-storing material is contained throughout the covering portion.

3. The light emitting device according to claim 1, wherein the covering portion has a stacked-layer structure and a layer containing the light-storing material is a top layer of the stacked-layer structure.

4. The light emitting device according to claim 1, wherein an outer periphery of each of the sealing members is arranged on the covering member, and the light-storing material is contained from below and outer side with respect to each of the sealing members.

5. A light emitting device comprising:
a substrate including a base member, a plurality of wiring portions disposed on a surface of the base member, and a covering portion partially covering the wiring portions such that a part of the wiring portions is not covered by the covering portion;
a plurality of light emitting elements respectively electrically connected to the wiring portions not covered by the covering portion; and
sealing members respectively sealing the light emitting elements,
wherein at least a part of the covering portion contains a light-storing material, and
a surface of the covering portion includes protrusions containing the light-storing material.

6. The light emitting device according to claim 1, wherein the sealing members include a fluorescent material.

7. A light emitting device comprising:
a substrate including a base member, a plurality of wiring portions disposed on a surface of the base member, and a covering portion partially covering the wiring portions such that a part of the wiring portions is not covered by the covering portion;
a plurality of light emitting elements respectively electrically connected to the wiring portions not covered by the covering portion; and
sealing members respectively sealing the light emitting elements,
wherein at least a part of the covering portion contains a light-storing material,
the light-storing material is $Sr_4Al_{16}O_{25}$:Eu,Dy, and
the sealing members contain a fluorescent material which is excited by at least a part of light from $Sr_4Al_{16}O_{25}$:Eu,Dy and emits light having a higher luminosity factor than a luminosity factor of the light from $Sr_4Al_{16}O_{25}$:Eu,Dy.

8. The light emitting device according to claim 6, wherein the fluorescent material includes a YAG-based fluorescent material, a CASN-based fluorescent material, or a combination of those.

9. The light emitting device according to claim 1, wherein the sealing members do not include the light-storing material.

10. The light emitting device according to claim 1, wherein the light storing material is at least one selected from the group consisting of sulfide-based fluorescent material, aluminate-based fluorescent material, and oxysulfide-based fluorescent material.

11. The light emitting device according to claim 1, wherein the light-storing material is $Sr_4Al_{16}O_{25}$:Eu,Dy.

12. The light emitting device according to claim 1, wherein the sealing members contain a fluorescent material that emits light having a wavelength equal to or longer than a wavelength of light emitted from the light-storing material.

13. The light emitting device according to claim 1, wherein an upper surface of the part of the covering portion containing the light-storing material is arranged lower than upper surfaces of the light emitting elements.

14. The light emitting device according to claim 5, wherein a top portion of each of the protrusions is arranged higher than upper surfaces of the light emitting elements.

15. The light emitting device according to claim 5, wherein the light-storing material is contained throughout the covering portion.

16. The light emitting device according to claim 5, wherein the covering portion has a stacked-layer structure and a layer containing the light-storing material is a top layer of the stacked-layer structure.

17. The light emitting device according to claim 5, wherein an outer periphery of each of the sealing members is arranged on the covering member, and the light-storing material is contained from below and outer side with respect to each of the sealing members.

18. The light emitting device according to claim 5, wherein the sealing members include a fluorescent material.

19. The light emitting device according to claim 5, wherein the light-storing material is $Sr_4Al_{16}O_{25}$:Eu,Dy, and the sealing members contain a fluorescent material which is excited by at least a part of light from $Sr_4Al_{16}O_{25}$:Eu, Dy and emits light having a higher luminosity factor than a luminosity factor of the light from $Sr_4Al_{16}O_{25}$:Eu,Dy.

20. The light emitting device according to claim 18, wherein
the fluorescent material includes a YAG-based fluorescent material, a CASN-based fluorescent material, or a combination of those.

21. The light emitting device according to claim 5, wherein the sealing members do not include the light-storing material.

22. The light emitting device according to claim 7, wherein the light-storing material is contained throughout the covering portion.

23. The light emitting device according to claim 7, wherein the covering portion has a stacked-layer structure and a layer containing the light-storing material is a top layer of the stacked-layer structure.

24. The light emitting device according to claim 7, wherein
an outer periphery of each of the sealing members is arranged on the covering member, and
the light-storing material is contained from below and outer side with respect to each of the sealing members.

25. The light emitting device according to claim 7, wherein the fluorescent material includes a YAG-based fluorescent material, a CASN-based fluorescent material, or a combination of those.

26. The light emitting device according to claim 7, wherein the sealing members do not include the light-storing material.

* * * * *